(12) United States Patent
Chen et al.

(10) Patent No.: US 11,249,524 B2
(45) Date of Patent: Feb. 15, 2022

(54) ELECTRONIC DEVICES WITH MOVABLE AIR FLOW DEVICES

(71) Applicant: Hewlett-Packard Development Company, L.P., Spring, TX (US)

(72) Inventors: Wei-Chung Chen, Taipei (TW); Kuan-Ting Wu, Taipei (TW)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 16/770,535

(22) PCT Filed: Dec. 6, 2017

(86) PCT No.: PCT/US2017/064793
§ 371 (c)(1),
(2) Date: Jun. 5, 2020

(87) PCT Pub. No.: WO2019/112573
PCT Pub. Date: Jun. 13, 2019

(65) Prior Publication Data
US 2021/0165471 A1 Jun. 3, 2021

(51) Int. Cl.
*G06F 1/20* (2006.01)
*G06F 1/16* (2006.01)
*H05K 7/20* (2006.01)

(52) U.S. Cl.
CPC ............ *G06F 1/203* (2013.01); *G06F 1/1662* (2013.01); *H05K 7/20172* (2013.01); *H05K 7/20209* (2013.01)

(58) Field of Classification Search
CPC ........ G06F 1/203; G06F 1/1662; G06F 1/206; G06F 1/1633; G06F 1/166; G06F 1/20; H05K 7/20172; H05K 7/20209; H05K 7/2039; F04D 25/166
See application file for complete search history.

(56) References Cited

U.S. PATENT DOCUMENTS

| | | | |
|---|---|---|---|
| 5,121,291 A * | 6/1992 | Cope | G06F 1/206 165/58 |
| 6,034,871 A * | 3/2000 | Cheng | G06F 1/203 165/104.34 |
| 7,871,319 B2 | 1/2011 | Tracy et al. | |
| 8,934,235 B2 * | 1/2015 | Rubenstein | F28D 15/0275 361/679.47 |

(Continued)

FOREIGN PATENT DOCUMENTS

| CN | 1987727 A | 6/2007 |
|---|---|---|
| CN | 102566721 B | 7/2012 |
| CN | 204759326 U | 11/2015 |

OTHER PUBLICATIONS

Notepal U3 Plus, 2014.

*Primary Examiner* — Michael A Matey
(74) *Attorney, Agent, or Firm* — Global IP Services PLLC

(57) ABSTRACT

In one example, an electronic device is described, which may include an enclosure having at least two openings, and at least two air flow devices disposed in the enclosure and corresponding to the at least two openings. The at least two air flow devices may be movable between a retracted position and an extended position. The at least two air flow devices can be within the enclosure in the retracted position and can be at least partially outside the enclosure through the at least two openings in the extended position.

14 Claims, 4 Drawing Sheets

(56) References Cited

U.S. PATENT DOCUMENTS

| | | | |
|---|---|---|---|
| 9,516,785 B2 | 12/2016 | Huang et al. | |
| 9,798,366 B2 | 10/2017 | Ho et al. | |
| 2004/0212958 A1* | 10/2004 | Jones | G06F 1/203 361/679.27 |
| 2005/0213302 A1 | 9/2005 | Lin | |
| 2006/0094347 A1 | 5/2006 | Tracy | |
| 2006/0181846 A1 | 8/2006 | Farnsworth et al. | |
| 2007/0041157 A1* | 2/2007 | Wang | G06F 1/203 361/679.54 |
| 2008/0024983 A1* | 1/2008 | Anderl | H05K 7/20727 361/695 |
| 2008/0084661 A1* | 4/2008 | Lee | G06F 1/203 361/679.48 |
| 2008/0288124 A1* | 11/2008 | Huang | G06F 1/206 700/300 |
| 2011/0170262 A1* | 7/2011 | Cheng | G06F 1/166 361/692 |
| 2011/0245976 A1 | 10/2011 | Thompson et al. | |
| 2013/0081779 A1* | 4/2013 | Liao | G06F 1/203 165/11.1 |
| 2017/0102746 A1* | 4/2017 | Knepper | G06F 1/203 |
| 2018/0108339 A1* | 4/2018 | Young | F04D 29/663 |
| 2019/0033897 A1* | 1/2019 | Barbier | G01F 1/50 |
| 2020/0337179 A1* | 10/2020 | Ku | G06F 1/1656 |
| 2020/0409436 A1* | 12/2020 | Watanabe | G06F 1/1698 |

\* cited by examiner

ELECTRONIC DEVICES WITH MOVABLE AIR FLOW DEVICES

BACKGROUND

Computers and other electronic devices contain numerous electronic components such as processors, memory, graphics products, and other integrated circuits (ICs) that may generate heat. The amount of heat generated by such electronic components may be increasing significantly over time due to the increase in the processing speed and/or enhancement of versatility and functionality. Electronic components can be heat-sensitive. Heat may cause malfunction or physical damage to the electronic components.

BRIEF DESCRIPTION OF THE DRAWINGS

Examples are described in the following detailed description and in reference to the drawings, in which.

DETAILED DESCRIPTION

Figure 1A:
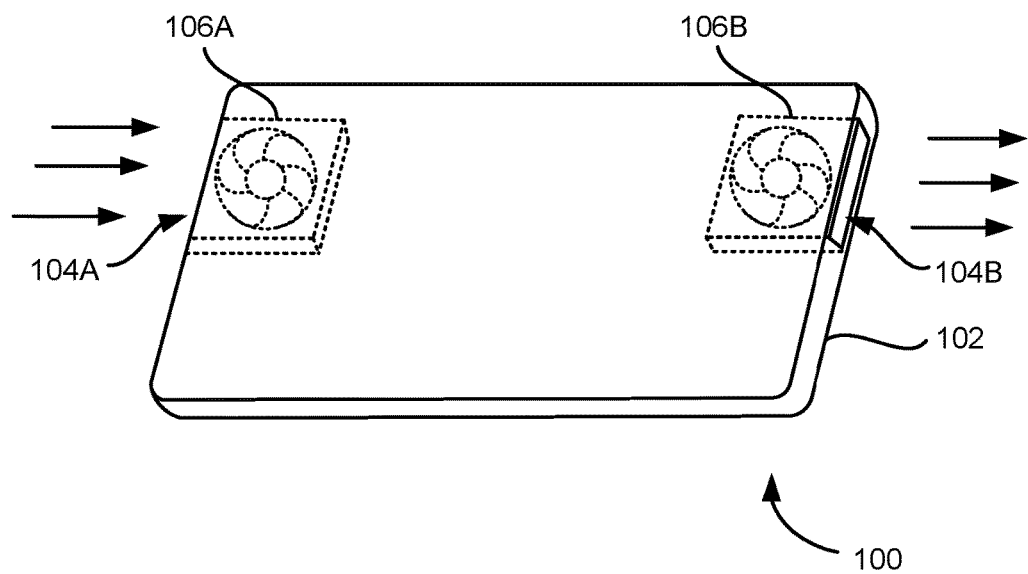
FIG. 1A illustrates a schematic representation of an example electronic device, depicting at least two air flow devices in a retracted position.

Electronic devices may generate heat during operation, which can affect the operation efficiency. As a result, electronic devices may be provided with heat dissipation modules or elements to assist the dissipation of heat out of the electronic devices. Example heat dissipation elements may include heat spreaders, fans, and the like. Fans may be used to dissipate the heat out of the electronic devices. The active air flow generated by the fan may cause convection between the interior and the exterior of the electronic device, thereby reducing the temperature of the interior of the electronic devices. However, the thermal convection on such electronic devices may be limited due to available free space in the interior of the electronic devices for such heat dissipation elements. Further, when the electronic device is operating in a high-performance mode, a significant amount of heat may be generated in the electronic device.

Examples described herein may provide an effective heat dissipation mechanism through thermal convection using two movable air flow devices (e.g., slidable drawer fans). The movable air flow devices may create free space within the enclosure to enhance heat transfer from the enclosure via the thermal convection. Examples described herein may enable the air flow devices to automatically slide out of the enclosure depending on a temperature of the electronic devices.

Examples described herein may extend the lifetime of electronic components of an electronic device, such as liquid crystal display (LCD) panels, light-emitting diodes (LEDs), central processing units (CPUs), batteries, and the like. Examples described herein may resolve hot spot issues in the electronic devices and reduce the risk of battery explosion. Examples described herein may prevent/reduce the electronic components from overheating, thereby reducing skin burning issues of users. Examples described herein may enhance information loading speed and power efficiency. Examples described herein may provide thermal solutions for electronic devices such as a notebook, tablet personal computer (PC), smart phone, television, gaming laptop, workstation, and the like.

In the following description, for purposes of explanation, numerous specific details are set forth in order to provide a thorough understanding of the present techniques. It will be apparent, however, to one skilled in the art that the present apparatus, devices and systems may be practiced without these specific details. Reference in the specification to "an example" or similar language means that a particular feature, structure, or characteristic described is included in at least that one example, but not necessarily in other examples.

Examples described herein may provide an electronic device including an enclosure. The enclosure may include at least two openings. Further, the electronic device may include at least two air flow devices disposed in the enclosure and corresponding to the at least two openings. The at least two air flow devices may be movable between a retracted position and an extended position. The at least two air flow devices can be within the enclosure in the retracted position and can be at least partially outside the enclosure through the at least two openings in the extended position. In one example, one air flow device may direct air into an interior area of the enclosure and another air flow device may direct the air from the interior area of the enclosure to outside.

Figure 1B:
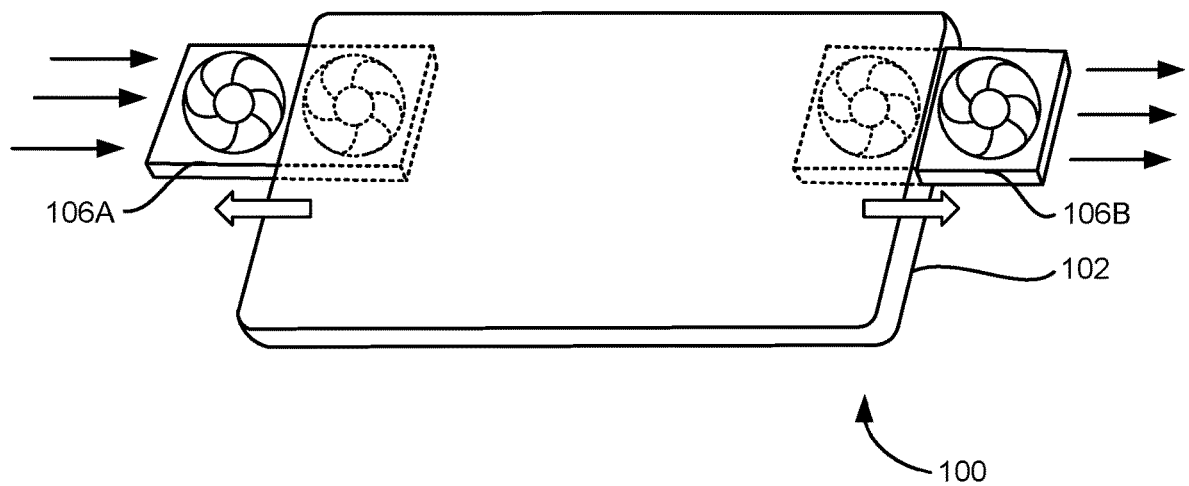
FIG. 1B illustrates a schematic representation of the example electronic device, depicting the at least two air flow devices in an extended position.

Turning now to the figures, FIG. 1A illustrates a schematic representation of an example electronic device 100, depicting at least two air flow devices 106A and 106B in a retracted position. FIG. 1B illustrates a schematic representation of example electronic device 100, depicting air flow devices 106A and 106B in an extended position. Example electronic device 100 may include a notebook, tablet, personal computer (PC), smart phone, television, gaming laptop, workstation, and the like. Electronic device 100 may include electronic components which may generate heat during operation. Example electronic components may include, but not limited to, a CPU, a graphics processor, a memory element, a display panel, a printed circuit board, means for wireless data exchange, sensors, and/or any other heat generating components.

Electronic device 100 may include an enclosure 102 including at least two openings 104A and 104B. Further, electronic device 100 may include at least two air flow devices 106A and 106B disposed in enclosure 102 and corresponding to openings 104A and 104B, respectively. In one example implementation, air flow devices 106A and 106B may extend on opposite sides of enclosure 102. Example air flow devices 106A and 106B may include blowers, fans, and the like.

In one example, air flow devices 106A and 106B may be movable between the retracted position and the extended position. In the retracted position, air flow devices 106A and 106B may be located within enclosure 102 (e.g., as shown in FIG. 1A). In the extended position, air flow devices 106A and 106B may be at least partially outside enclosure 102 through respective openings 104A and 104B (e.g., as shown in FIG. 1B). Air flow devices 106A and 106B may be automatically extended depending on a temperature of an interior area of enclosure 102. Air flow devices 106A and 106B, in the extended position, may create free space within enclosure 102 to effectively dissipate heat from electronic device 100 via thermal convection.

As shown in FIG. 1A, air flow device 106A may direct air (e.g., cool air) into enclosure 102 and air flow device 106B may direct the air (e.g., hot air) from enclosure 102 to outside. In some examples, air flow device 106A may direct an air flow inwardly through opening 104A and air flow device 106B may discharge or exhaust the air flow through opening 104B. In one example, air flow devices 106A and 106B in the extended position may dissipate the heat from an interior of enclosure 102. In other examples, air flow devices 106A and 106B can also dissipate the heat from the interior of enclosure 102 when heat dissipation is needed in the retracted position.

Air flow devices 106A and 106B may be movable between the retracted position and the extended position by sliding, rotating, or tilting air flow devices 106A and 106B in and out of enclosure 102. In one example implementation, electronic device 100 may include at least two drive motors, with each drive motor connected to one of air flow devices 106A and 1066. During operation, the drive motors may drive air flow devices 106A and 1066 between the retracted position and the extended position depending on the temperature of the interior area of enclosure 102.

Figure 2:
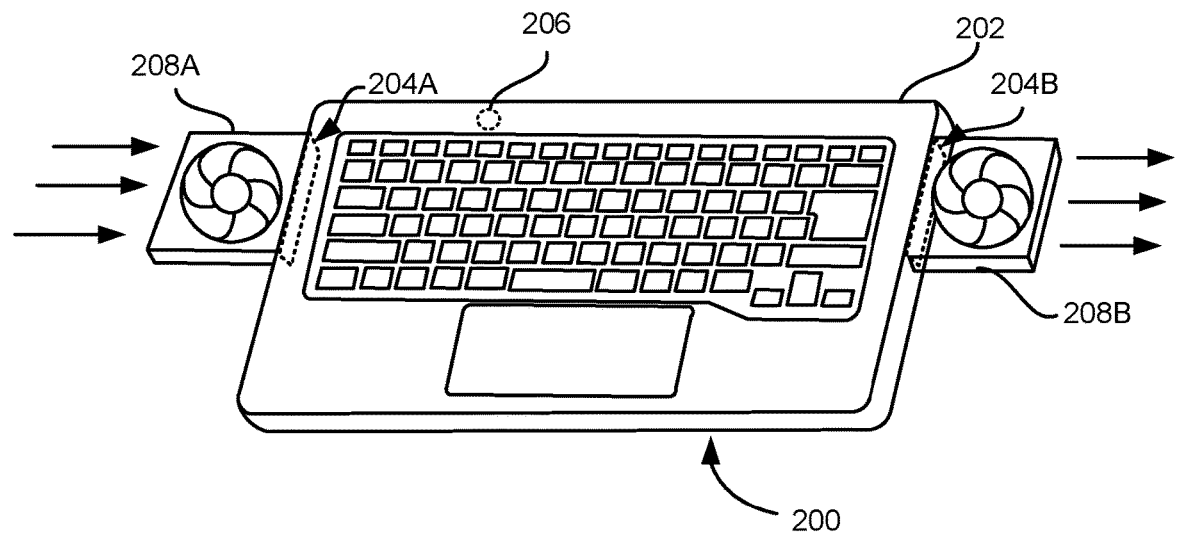
FIG. 2 illustrates a schematic representation of an example keyboard housing, depicting at least two air flow devices in an extended position.

FIG. 2 illustrates a schematic representation of an example keyboard housing 200, depicting air flow devices 208A and 208B in an extended position. Example keyboard housing 200 may house a keyboard, a battery, a touchpad, and so on. Further, keyboard housing 200 may be coupled to a display.

Keyboard housing 200 may include an enclosure 202 having at least two openings 204A and 204B, for instance, on opposite short sides of enclosure 202. Further, keyboard housing 200 may include at least one sensor 206 to detect a temperature within an interior area of enclosure 202. Furthermore, keyboard housing 200 may include air flow devices 208A and 208B disposed within enclosure 202 and corresponding to openings 204A and 204B. Air flow devices 208A and 208B may be movable at least partially outside enclosure 202 through openings 204A and 204B to dissipate heat from the interior area of enclosure 202 in response to the temperature of the interior area of enclosure 202 exceeding a predetermined threshold.

In another example, air flow devices 208A and 208B may be retractable to a position within enclosure 202 to dissipate heat from the interior area of enclosure 202 in response to the temperature of the interior area of enclosure 202 falling below the predetermined threshold. As shown in FIG. 2, one air flow device (e.g., 208A) may direct air into the interior area of enclosure 202 and another air flow device (e.g., 208B) may direct the air from the interior area of enclosure 202 to outside. Further as shown in FIG. 2, openings 204A and 204B may be provided on opposite short sides of enclosure 202 such that the air enters enclosure 202 from one opening (e.g., 204A) and leaves enclosure 202 through other opening (e.g., 204B) using respective air flow devices 208A and 208B, which may extend at least partially outside enclosure 202 on the opposite short sides.

As shown in FIG. 2, air flow devices 208A and 208B may extend at least partially outside enclosure 202 via sliding. In other examples, air flow devices 208A and 208B may also extend via rotating, rotatably sliding, or tilting about a fixed pivot such that air flow devices 208A and 208B may move at least partially outside enclosure 202 through openings 204A and 204B, respectively.

Figure 3A:
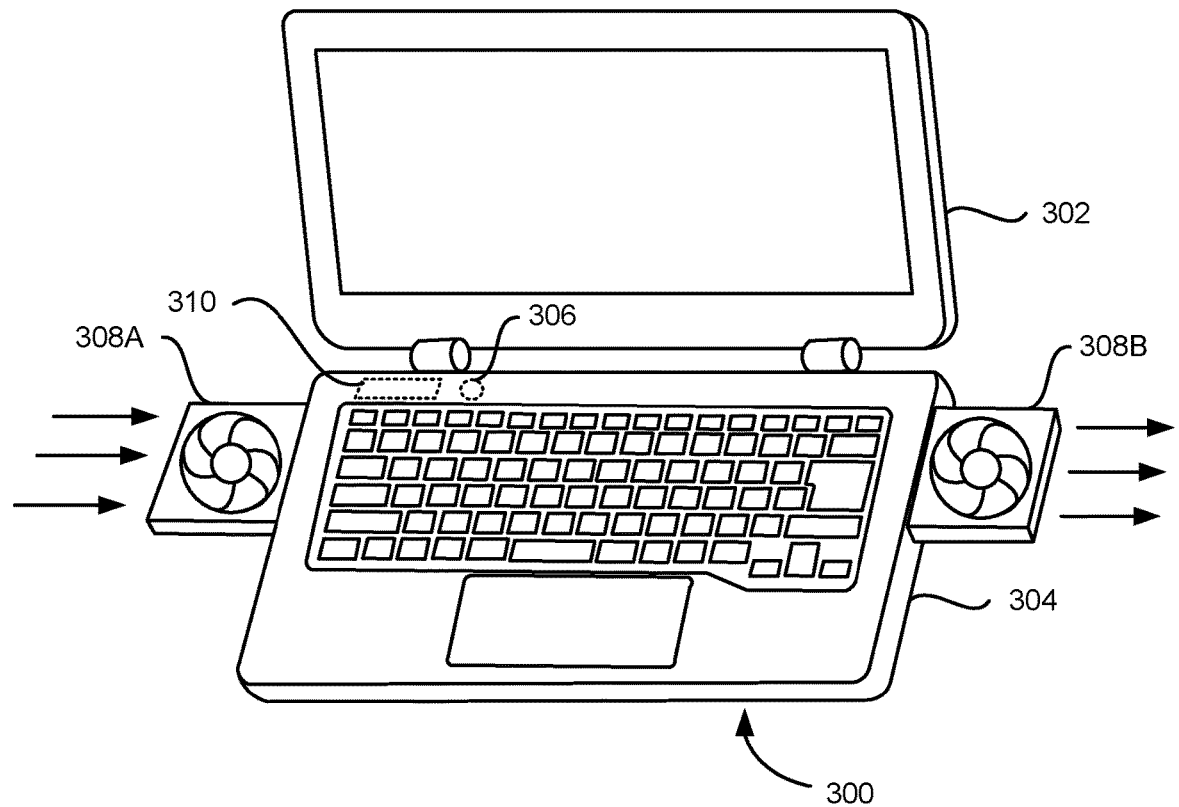
FIG. 3A illustrates a schematic representation of an example electronic device, depicting the at least two air flow devices in an extended position.

FIG. 3A illustrates a schematic representation of an example electronic device 300, depicting air flow devices 308A and 308B in an extended position. Example electronic device 300 may be a notebook computer, a tablet computer, a convertible device, a personal gaming device, and the like. Example convertible device may refer to a device that can be "convertible" from a laptop mode to a tablet mode. Electronic device 300 may include a display housing 302 and a base housing 304 communicatively connected to display housing 302. In one example, display housing 302 may be rotatably, detachably, twistably, or externally connected to base housing 304. Display housing 302 may house a display (e.g., a touchscreen display). Example display may include liquid crystal display (LCD), light emitting diode (LED) display, electro-luminescent (EL) display, or the like.

Base housing 304 may house a keyboard, touchpad, battery and the like. Electronic device 300 may also be equipped with other components such as a camera, audio/video devices, and the like, depending on the functions of electronic device 300. Base housing 304 may include at least one sensor 306 to detect a temperature within an interior area of base housing 304. Further, base housing 304 may include air flow devices 308A and 308B. Furthermore, base housing 304 may include a control unit 310 to move air flow devices 308A and 308B between a retracted position and an extended position based on the detected temperature. Air flow devices 308A and 308B may be located within base housing 304 in the retracted position and may be at least partially outside base housing 304 in the extended position.

In one example, control unit 310 may move air flow devices 308A and 308B to the extended position when the temperature of base housing 304 exceeds a threshold value. In another example, control unit 310 may move air flow devices 308A and 308B to the retracted position when the temperature of base housing 304 falls below the threshold value.

Figure 3B:
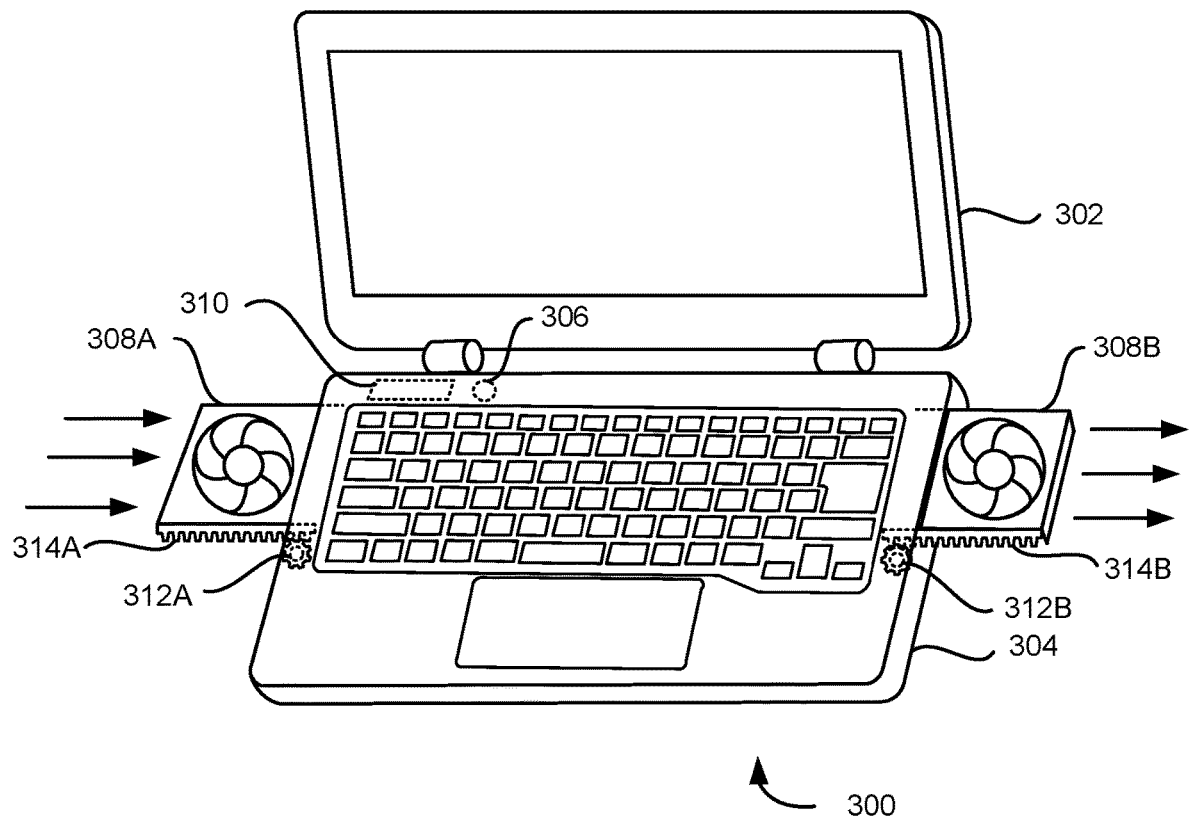
FIG. 3B illustrates a schematic representation of the example electronic device, depicting additional features to move the at least two air flow devices to the extended position.

FIG. 3B illustrates a schematic representation of example electronic device 300, depicting additional features to move air flow devices 308A and 308B to the extended position. As shown in FIG. 3B, base housing 304 may include at least two drive motors 312A and 312B. Each drive motor 312A or 312B may be connected to a respective one of air flow devices 308A and 308B. In one example, control unit 310 may control/actuate drive motors 312A and 312B to move air flow devices 308A and 308B between the retracted position and the extended position.

Further as shown in FIG. 3B, base housing 304 may include at least two movable gear racks 314A and 314B. Each movable gear rack 314A or 314B may be connected to a respective one of air flow devices 308A and 308B. In some examples, airflow devices 308A and 308B may be mounted on movable gear racks 314A and 314B. In other examples, movable gear rack 314A or 314B may be attached to air flow devices 308A and 308B (e.g., fan units) by laser wielding, gluing, fastening, or the like. Drive motors 312A and 312B may include gears which may engage with gears of a respective one of movable gear racks 314A and 314B to move air flow devices 308A and 308B between the retracted position and the extended position. For example, drive motors 312A and 312B may include gear motors. An example mechanism for drive motors 312A and 312B is explained in FIG. 4.

Figure 4:
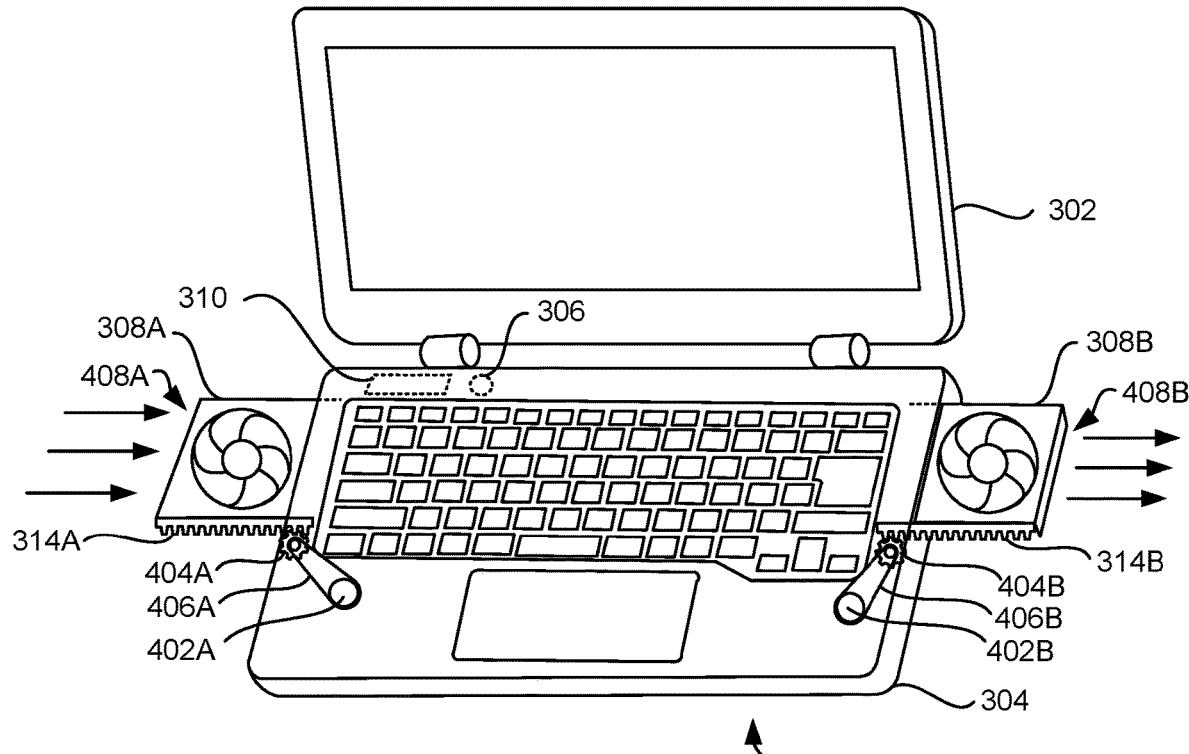
FIG. 4 illustrates a schematic representation of an example electronic device including an example gear motor mechanism to move at least two air flow devices to an extended position.

FIG. 4 illustrates a schematic representation of an example electronic device 400, such as electronic device 300 of FIG. 3, including an example structure/mechanism of drive motors 312A and 312B to move air flow devices 308A and 308B to the extended position. As shown in FIG. 4, drive motor 312A may include a motor 402A, a gear wheel 404A connected to motor 402A through a transmission belt 406A. Further, gear wheel 404A may engage with gears of movable gear rack 314A. During operation, motor 402A may rotate gear wheel 404A through transmission belt 406A, which may in turn push movable gear rack 314A outside base housing 304. Similarly, drive motor 312B may include a motor 402B, a gear wheel 404B, and a transmission belt 406B to move movable gear rack 314B outside base housing 304. Air flow devices 308A and 308B may include respective vents 408A and 408B to direct the air into and out of base housing 304. Also in some examples, air flow devices 308A and 308B may include filters for filtering the air entering or exiting base housing 304.

FIG. 4 describes an example structure/mechanism to move air flow devices 308A and 308B to an extended position, however, other structures/mechanisms can also be used to move air flow devices 308A and 308B to the extended position. For example, each gear motor may include a shaft and at least one gear wheel fixedly coupled to the shaft. Further, each gear wheel may engage with gears of a respective movable gear rack 314A or 314B such that rotation of the shaft (i.e., upon activation of the gear motor) may rotate the gear wheels which in turn pushes movable gear racks 314A or 314B outside base housing 304.

Figure 5:
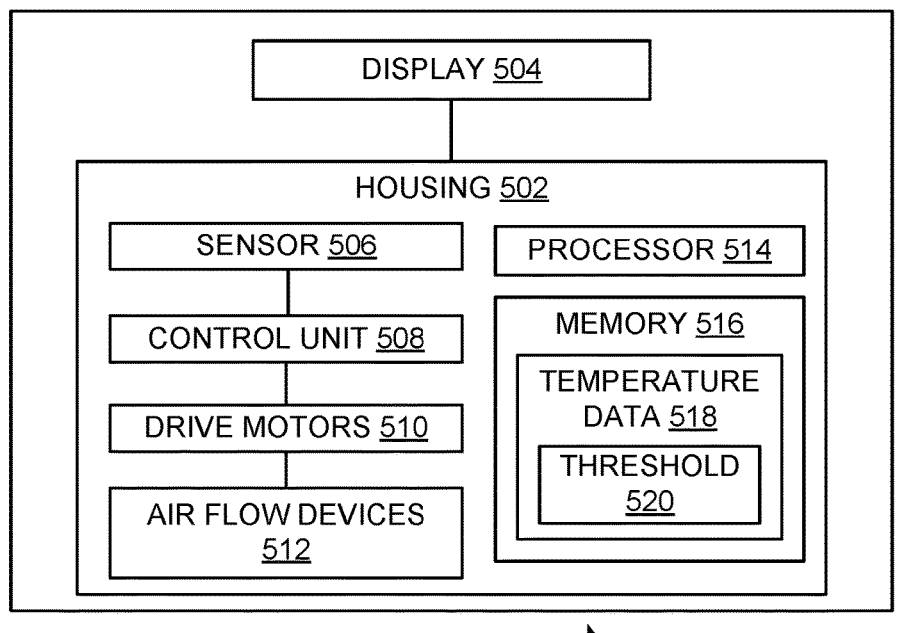
FIG. 5 illustrates a block diagram of an example electronic device.

FIG. 5 illustrates a block diagram of an example electronic device 500. Electronic device 500 may include a housing 502 and a display 504. Display 504 may be internal or external to housing 502. In the examples illustrated in FIG. 5, housing 502 may include a sensor 506, a control unit 508, a drive motor 510, air flow devices 512, a processor 514, and a memory 516. Control unit 508 may include hardware, software, or a combination of hardware and software. In some examples, control unit 508 can be stored in memory 516 (e.g., computer-readable storage medium comprising instructions) and executable by processor 514.

During operation, sensor 506 may be disposed or otherwise located in or near the interior area of housing 502 to determine or otherwise detect temperature conditions within the interior area of housing 502. In some examples, the temperature readings or measurements obtained by sensor 506 may be received by control unit 508 and compared to temperature data 518 stored in memory 516. If a temperature measurement or reading detected by sensor 506 exceeds a temperature threshold 520, control unit 508 may cause or otherwise actuate drive motors 510 to extend air flow devices 512. Further, if the temperature reading or measurement detected by temperature sensor 506 falls below temperature threshold 520, control unit 508 may cause drive motors 510 to automatically retract air flow devices 512.

In some examples, control unit 508 may automatically initiate or activate drive motors 510 to slide air flow devices 512 in response to the temperature within the interior area exceeding temperature threshold 520. For example, control unit 508 may interface with air flow devices 512 such that upon sliding air flow devices 512 outside housing 502, air flow devices 512 may be automatically activated to generate an air flow inwardly and/or outwardly through openings defined in housing 502.

In other examples, control unit 508 may interface with air flow devices 512 either directly or indirectly to extend and/or retract air flow devices 512 in response to temperature variations within the interior area and/or at predetermined time intervals. In other examples, the extension and retraction of air flow devices 512 can also be activated automatically, for instance, by opening and closing display 504 with respect to housing 502 of electronic device 500 (e.g., in case of laptops).

In some other examples, the extension and retraction may be based on an operating mode of electronic device 500. Depending on user preference and/or operation requirements, electronic device 500 can operate in two different modes. In a battery savings mode or low-power mode, the CPU operates at a low clock speed and thus consumes less power and generates less heat. In this mode, air flow devices 512 may operate in the retracted position. In a high-power mode, the CPU runs at full speed and generates maximum power. Here, air flow devices 512 may move to the extended position. In further examples, electronic device 500 can operate in one mode with air flow devices 512 operating in the extended position once electronic device 500 is powered on.

As described above, air flow devices 512 may direct an air flow outwardly and/or inwardly through the openings. Further, in some examples, one air flow device 510 may draw an air flow inwardly through one opening and other air flow device 510 may discharge or exhaust the air flow through another opening. Thus, examples described herein may enable dissipation of thermal energy from within interior area convectively via air flow devices 512. Further, examples described herein may provide enhanced cooling of electronic device 500.

It may be noted that the above-described examples of the present solution are for the purpose of illustration only. Although the solution has been described in conjunction with a specific implementation thereof, numerous modifications may be possible without materially departing from the teachings and advantages of the subject matter described herein. Other substitutions, modifications and changes may be made without departing from the spirit of the present solution. All of the features disclosed in this specification (including any accompanying claims, abstract and drawings), and/or all of the steps of any method or process so disclosed, may be combined in any combination, except combinations where at least some of such features and/or steps are mutually exclusive.

The terms "include," "have," and variations thereof, as used herein, have the same meaning as the term "comprise" or appropriate variation thereof. Furthermore, the term "based on", as used herein, means "based at least in part on." Thus, a feature that is described as based on some stimulus can be based on the stimulus or a combination of stimuli including the stimulus.

The present description has been shown and described with reference to the foregoing examples. It is understood, however, that other forms, details, and examples can be made without departing from the spirit and scope of the present subject matter that is defined in the following claims.

What is claimed is:

1. An electronic device comprising:
an enclosure including at least two openings; and
at least two air flow devices, automatically extended depending on a temperature of an interior area of the enclosure, disposed in the enclosure and corresponding to the at least two openings, wherein the at least two air flow devices are movable between a retracted position and an extended position, wherein the at least two air flow devices are within the enclosure in the retracted position and are at least partially outside the enclosure through the at least two openings in the extended position, and wherein the at least two air flow devices extend on opposite sides of the enclosure.

2. The electronic device of claim 1, wherein the at least two air flow devices comprise:
a first air flow device to direct air into the enclosure; and
a second air flow device to direct the air from the enclosure to outside.

3. The electronic device of claim 1, wherein the at least two air flow devices are movable between the retracted position and the extended position by sliding, rotating, or tilting the at least two air flow devices in and out of the enclosure.

4. The electronic device of claim 1, further comprising:
at least two drive motors, wherein each drive motor is connected to one of the at least two air flow devices, and wherein the at least two drive motors are to drive the at least two air flow devices between the retracted position and the extended position.

5. A keyboard housing of an electronic device, comprising:
an enclosure including at least two openings;
at least one sensor to detect a temperature within an interior area of the enclosure; and
at least two air flow devices disposed within the enclosure and corresponding to the at least two openings, wherein the at least two air flow devices are movable at least partially outside the enclosure through the at least two openings to dissipate heat from the interior area of the enclosure in response to the temperature of the interior area of the enclosure exceeding a predetermined threshold.

6. The keyboard housing of claim 5, wherein one air flow device of the at least two air flow devices is to direct air into the interior area of the enclosure and another air flow device is to direct the air from the interior area of the enclosure to outside.

7. The keyboard housing of claim 5, wherein the at least two air flow devices are to extend at least partially outside the enclosure by sliding, rotating, or tilting the at least two air flow devices.

8. The keyboard housing of claim 5, wherein the at least two openings are provided on opposite short sides of the enclosure such that air enters the enclosure from one opening and leaves the enclosure through another opening using the at least two air flow devices which extend at least partially outside the enclosure on the opposite short sides.

9. The keyboard housing of claim 5, wherein the at least two air flow devices are retractable to a position within the enclosure to dissipate heat from the interior area of the enclosure in response to the temperature of the interior area of the enclosure falling below the predetermined threshold.

10. An electronic device comprising:
a display housing; and
a base housing communicatively connected to the display housing, wherein the base housing comprises:
at least one sensor to detect a temperature within an interior area of the base housing;
at least two air flow devices; and
a control unit to move the at least two air flow devices between a retracted position and an extended position based on the detected temperature, where the at least two air flow devices are within the base housing in the retracted position and are at least partially outside the base housing in the extended position.

11. The electronic device of claim 10, wherein the base housing further comprises:
at least two drive motors, wherein each drive motor is connected to one of the at least two air flow devices, and wherein the control unit is to control the at least two drive motors to move the at least two air flow devices between the retracted position and the extended position.

12. The electronic device of claim 11, wherein the base housing further comprises:
at least two movable gear racks, wherein each movable gear rack is connected to one of the at least two air flow devices, and wherein each drive motor comprises gears which engage with gears of the at least two movable gear racks to move the at least two air flow devices between the retracted position and the extended position.

13. The electronic device of claim 10, wherein the control unit is to:
move the at least two air flow devices to the extended position when the temperature of the base housing exceeds a threshold value; and
move the at least two air flow devices to the retracted position when the temperature of the base housing falls below the threshold value.

14. The electronic device of claim 10, wherein one air flow device of the at least two air flow devices is to direct air into the interior area of the base housing and another air flow device is to direct the air from the interior area of the base housing to outside.

\* \* \* \* \*